United States Patent [19]
Glovatsky et al.

[11] Patent Number: 5,706,170
[45] Date of Patent: Jan. 6, 1998

[54] VENTILATION DUCT WITH INTEGRATED ELECTRONICS ENCLOSURE

[75] Inventors: Andrew Zachary Glovatsky, Ypsilanti; Michael George Todd, South Lyon; Peter Joseph Sinkunas, Canton, all of Mich.

[73] Assignee: Ford Motor Company, Dearborn, Mich.

[21] Appl. No.: 642,726

[22] Filed: May 3, 1996

[51] Int. Cl.$^6$ .................................................. H05K 7/20
[52] U.S. Cl. .................... 361/695; 174/35 GC; 296/208; 307/10.1; 361/627; 454/127
[58] Field of Search ...................... 296/146.1, 154, 296/192, 204, 208; 165/80.3, 122, 126; 62/175, 244, 259.2; 174/70 C, 72 A, 254, 35 R, 35 GC; 307/9.1, 10.1; 454/124, 127, 152, 160, 146, 900; 280/789; 361/600, 601, 627, 689, 690, 691, 694, 807, 695–697, 717–720, 809, 810, 816, 818, 826, 827

[56] References Cited

U.S. PATENT DOCUMENTS

| | | | |
|---|---|---|---|
| 4,390,124 | 6/1983 | Nilsson | 237/12.3 |
| 4,500,943 | 2/1985 | Greene | 361/690 |
| 5,156,568 | 10/1992 | Ricci | 454/129 |
| 5,354,114 | 10/1994 | Kelman | 296/192 |
| 5,422,787 | 6/1995 | Gourdine | 361/697 |
| 5,442,518 | 8/1995 | Beam | 361/690 |
| 5,549,344 | 8/1996 | Nishijima | 296/70 |

*Primary Examiner*—Gerald P. Tolin
*Attorney, Agent, or Firm*—Leslie C. Hodges; Roger L. May

[57] ABSTRACT

An apparatus is provided for both conveying air and for housing electronic devices in a vehicle. The apparatus comprises a molded ventilation duct with a parallel housing secured to the duct for housing electronic devices. The housing is molded integrally with the duct and metallized with electronic circuitry and devices. This design improves packaging efficiency underneath the vehicle instrument panel.

10 Claims, 6 Drawing Sheets

5,706,170

VENTILATION DUCT WITH INTEGRATED ELECTRONICS ENCLOSURE

TECHNICAL FIELD

The present invention relates to an apparatus for storing electronic devices in a vehicle and, more particularly, in a preferred embodiment, to a ventilation duct with an integrated electronics enclosure.

BACKGROUND OF THE INVENTION

Typically, active electronic devices stored beneath a vehicle instrument panel are mounted on a thin substrate enclosed within a metal box or housing having bundles of wires (wire harnesses) running into and out of the metal box (electronic module). The metal box or electronic module must be mounted to a support structure beneath the instrument panel and supported in an appropriate position, preferably behind the center stack bezel and under the instrument topper pad of the instrument panel for providing electronic support to the vehicle temperature control and sound systems, as well as other electronic modules housed in the instrument panel.

This assembly can consume a substantial amount of space beneath the instrument panel. The bulky metal box with bundles of wires extending therefrom will have substantial space requirements, and will adversely affect packaging design efficiency in the vehicle. Furthermore, the metal box adds to manufacturing costs and adds significant weight.

It is desirable to provide an apparatus for storing such electronic devices beneath the instrument panel assembly in a manner in which packaging efficiency is improved and manufacturing costs and weight are reduced. It is further desirable to improve serviceability of the assembly.

DISCLOSURE OF THE INVENTION

The present invention overcomes the above referenced shortcomings of prior art assemblies for storing electronic devices beneath an instrument panel by providing an electronic device storage housing which is molded integrally with a ventilation duct. The housing is supported by the ventilation duct, and is not in fluid communication with the duct. The housing includes a lower support member for supporting the electronic devices and a cover which overhangs the electronic devices for diverting liquids away from the electronic devices.

More specifically, the present invention provides an apparatus for conveying air and for housing electronic devices in a vehicle, comprising a molded duct for conveying air in the vehicle, and a housing molded into the duct for housing electronic devices. In a preferred embodiment, the duct includes first and second mating shell portions, and the housing comprises a support portion extending from the second shell portion, and a cover extending from the first shell portion for cooperation with the support portion to form the housing for enclosing the electronic devices. A score line is formed between the cover and the duct to facilitate bending of the cover with respect to the duct for access to the electronic devices.

Accordingly, an object of the present invention is to provide an apparatus for both conveying air and for housing electronic devices in a vehicle in a manner in which packaging efficiency is improved.

The above object and other objects, features and advantages of the present invention are readily apparent from the following detailed description of the best modes for carrying out the invention when taken in connection with the accompanying drawings.

BEST MODES FOR CARRYING OUT THE INVENTION

Figure 1:
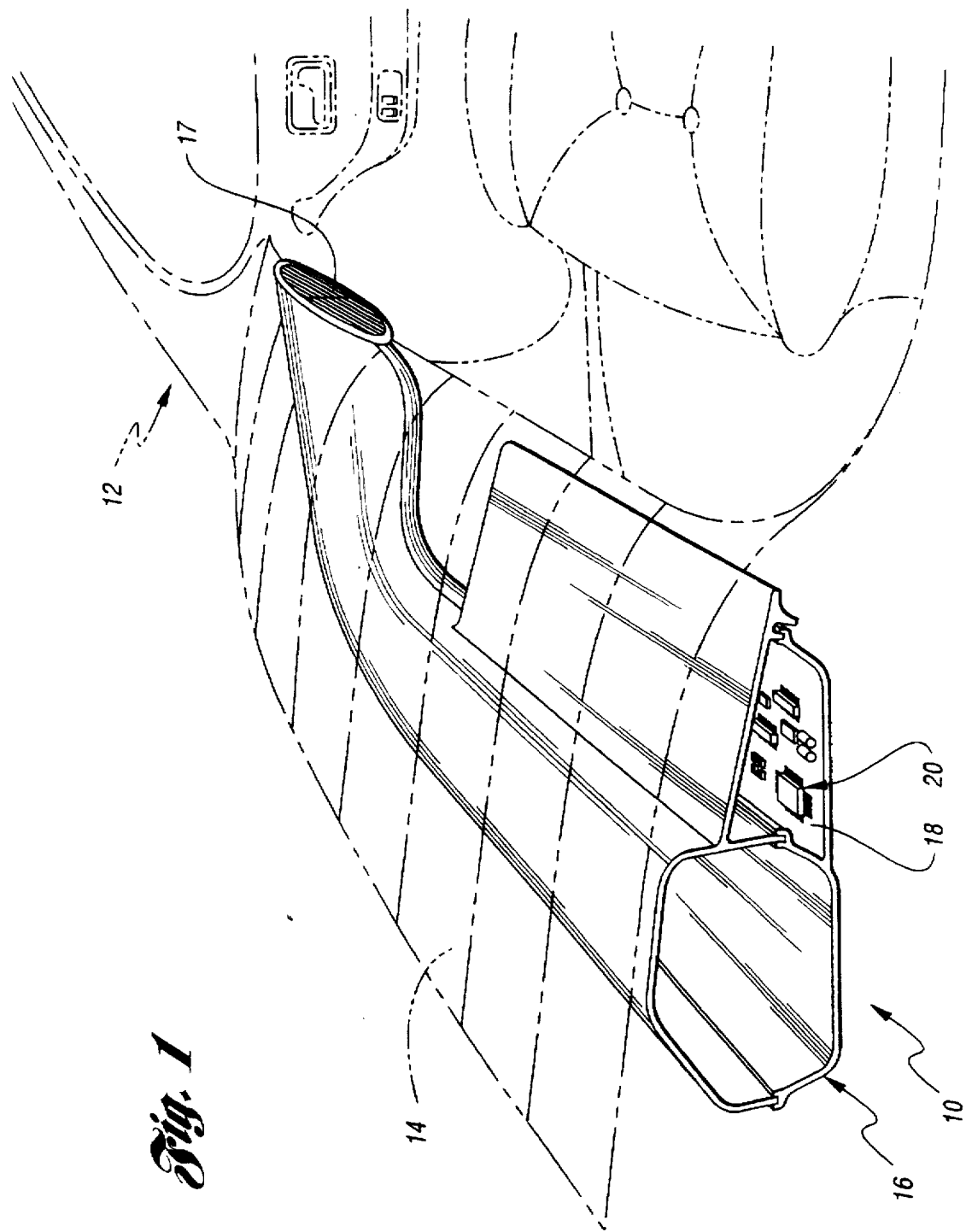
FIG. 1 shows a partially cutaway environmental perspective view of an apparatus for housing electronic devices beneath a vehicle instrument panel in accordance with the present invention.

The present invention is shown in environmental perspective view in FIG. 1. FIG. 1 shows an apparatus 10 for both conveying air and for housing electronic devices in a vehicle 12 beneath the vehicle instrument panel cover (topper pad) 14. As shown in FIGS. 1-4, the invention comprises an innovative ventilation duct 16 incorporating a parallel housing 18 for enclosing electronic devices 20 beneath the vehicle instrument panel 14. The duct 16 comprises first and second molded mating shell portions 22, 24. The edges 26, 28 of the second portion 24 include slots formed therealong for receiving the edges 30, 32 of the first shell portion 22, respectively. The ventilation duct 16 includes a vent register 17 at the end thereof for communication with the passenger compartment.

Integrally molded with the second shell portion 24 is a support portion 34 extending therefrom for supporting the electronic devices 20. A cover 36 is integrally molded with the first shell portion 22 and overhangs the support portion 34 in a manner to act as a watershed to keep spilled liquids away from the electronic devices 20 and prevent any physical damage to the devices. The outboard portion 38 of the support portion 34 includes a slot extending longitudinally therealong for cooperation with the outboard portion 40 of the cover 36 to form the enclosed housing. If the electronics were disposed within the main duct, they would experience high levels of humidity, which would adversely affect their reliability.

This parallel cavity type housing formed in the molding process provides a separate mechanical enclosure integrated with the main duct for placement of the electronics. The electronics can be directly mounted on metallized circuits on the plastic or prefabricated electronic assemblies can be secured in the enclosure.

The cover 36 and first shell portion 22 may include a score line 42 therebetween or other flexible hinge design which allows the cover 36 to be hinged with respect to the first shell portion 22 of the duct in order to allow access to the electronics 20 for repair or function upgrades. This score line hinge also provides a seal to prevent entry of liquids. The high fatigue resistance of common ventilation duct materials, such as ABS and polypropylene (PP), allow for this unique feature to be utilized.

Figure 2:
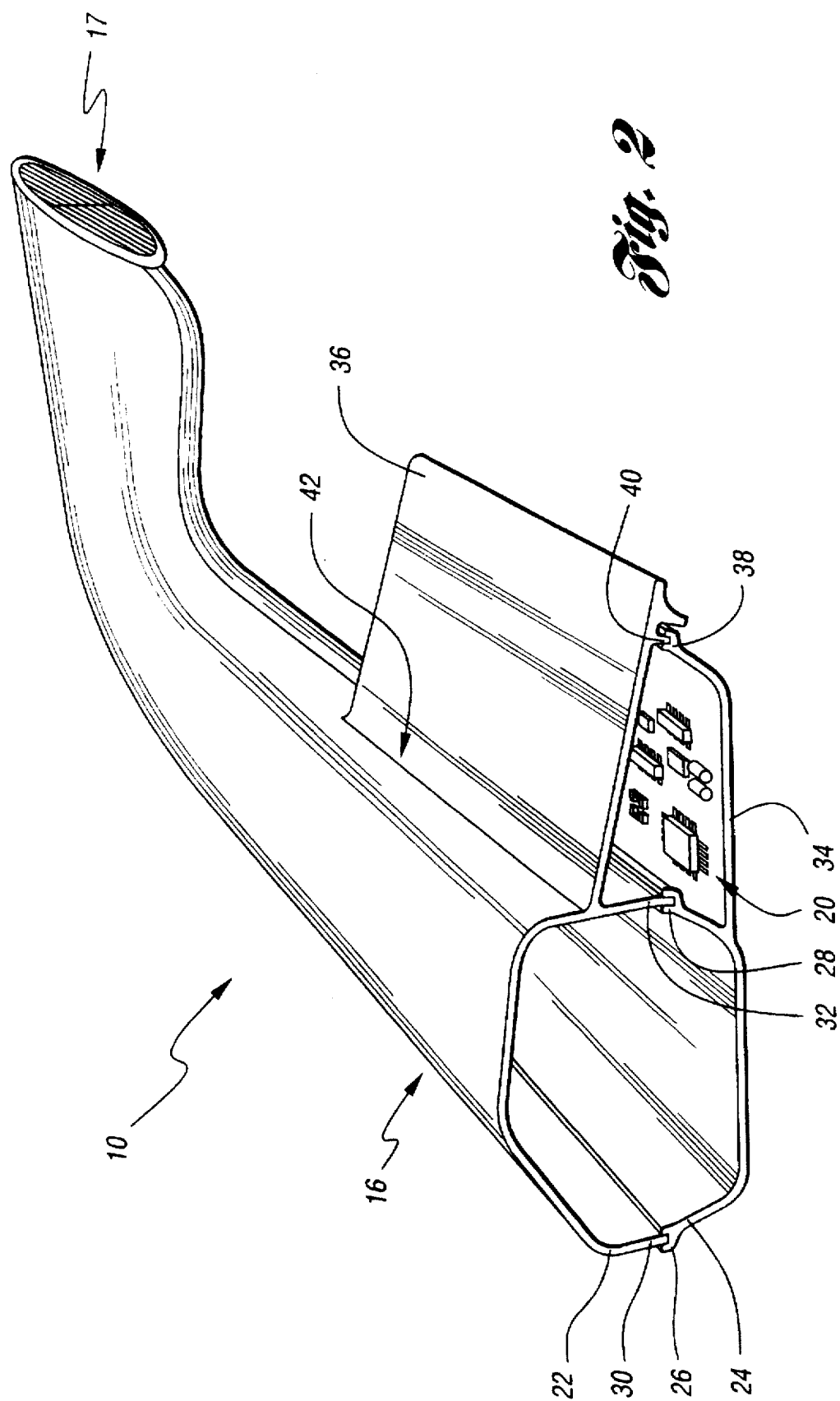
FIG. 2 shows a partially cutaway perspective view of a ventilation duct and electronics housing in accordance with the present invention.
Figure 3:
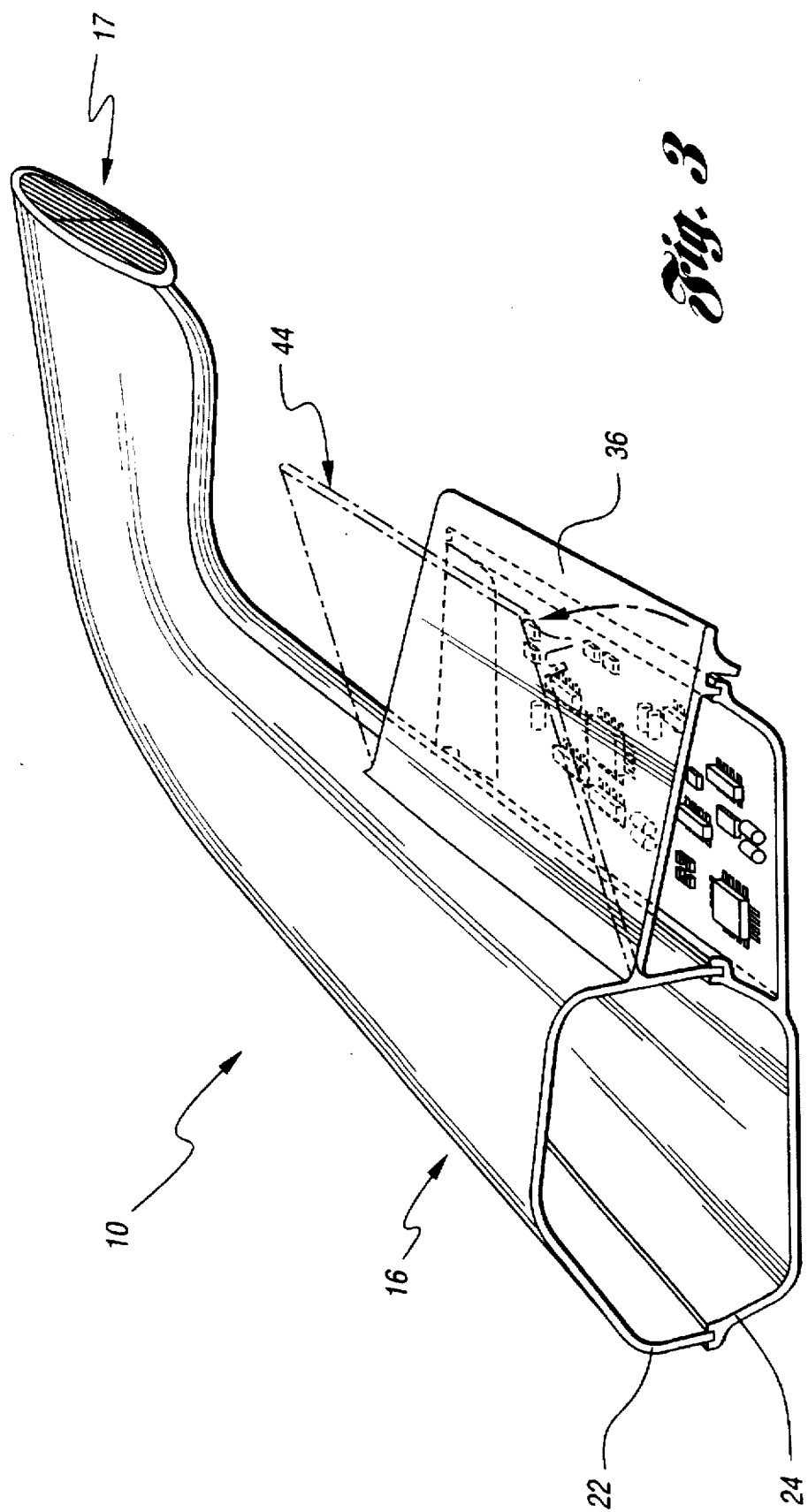
FIG. 3 shows a partially cutaway perspective view of the assembly shown in FIG. 2, with the housing cover shown in phantom in a pivoted position.

The hinging feature is illustrated more clearly in FIG. 3. The cover 36 may be pivoted from the closed position, as shown in FIG. 2, to the open position 44 shown in phantom in FIG. 3. This enclosure provides a watershed, a physical barrier or shield preventing liquids from entering or contacting the electronics. The fluids may be from incidental spillage or leaks from the vehicle.

Figure 4:
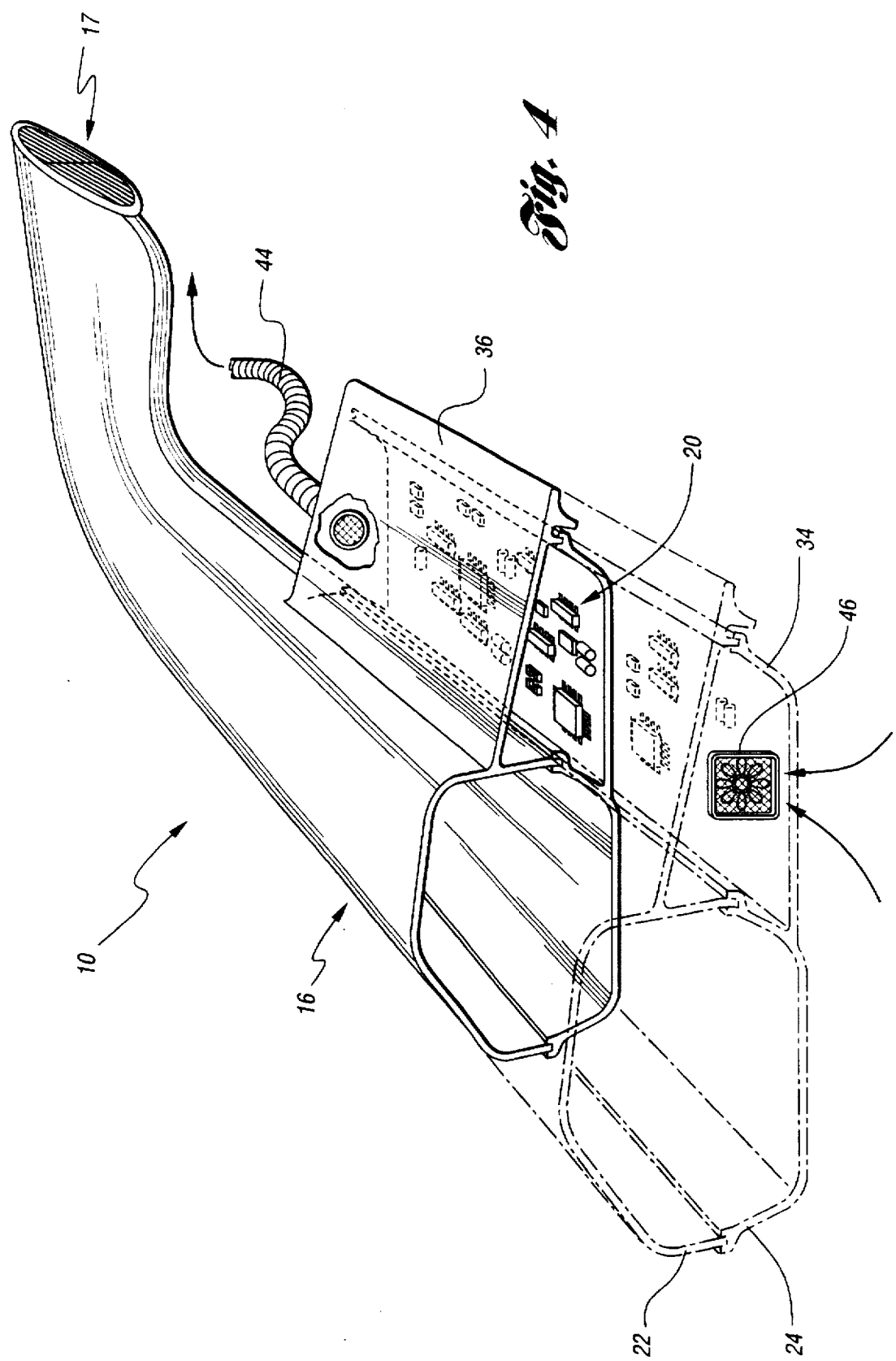
FIG. 4 shows a schematically arranged, partially cutaway perspective view of the ventilation duct and electronics housing with a blower fan disposed within the electronics housing in accordance with the present invention.

Thermal management of the enclosure can be controlled by providing a fan 46, as shown in FIG. 4, mounted within the housing 18 for forcing vehicle interior ambient air or dehumidified air from the HVAC (heating ventilation and conditioning unit) through the housing to cool the electronics. The fan is filtered and can be electronically controlled to allow only treated air. Treated air can be dehumidified and cooled to be within a specific temperature range before it is allowed into the enclosure for cooling. The exit air can be ducted to the exterior of the vehicle, such as through tube 44 shown in FIG. 4, or it may be recirculated into the ventilation system. This convective cooling strategy eliminates exposing the electronics to highly humid air, which could cause a reliability issue. The use of ambient air also provides a relatively constant temperature cooling air (60° F. to 80° F.) for cooling the electronics enclosure.

The enclosure/housing 18 can be made EMI (electromagnetic interference)/RFI (radio frequency interference) protected by metallizing the exterior of the housing 18. This can be achieved by vacuum metallizing, plating, thermal forming conductive metal shielding materials or by simply bonding metal shields to the outer surface of the enclosure.

Of course, the design can be changed accordingly to accommodate placement of an airbag module and/or other modules underneath the instrument panel topper pad. The design can further be modified to accommodate any position within the interior of a vehicle. This design can also be used in under-hood applications with varying cooling strategies.

Figure 5:
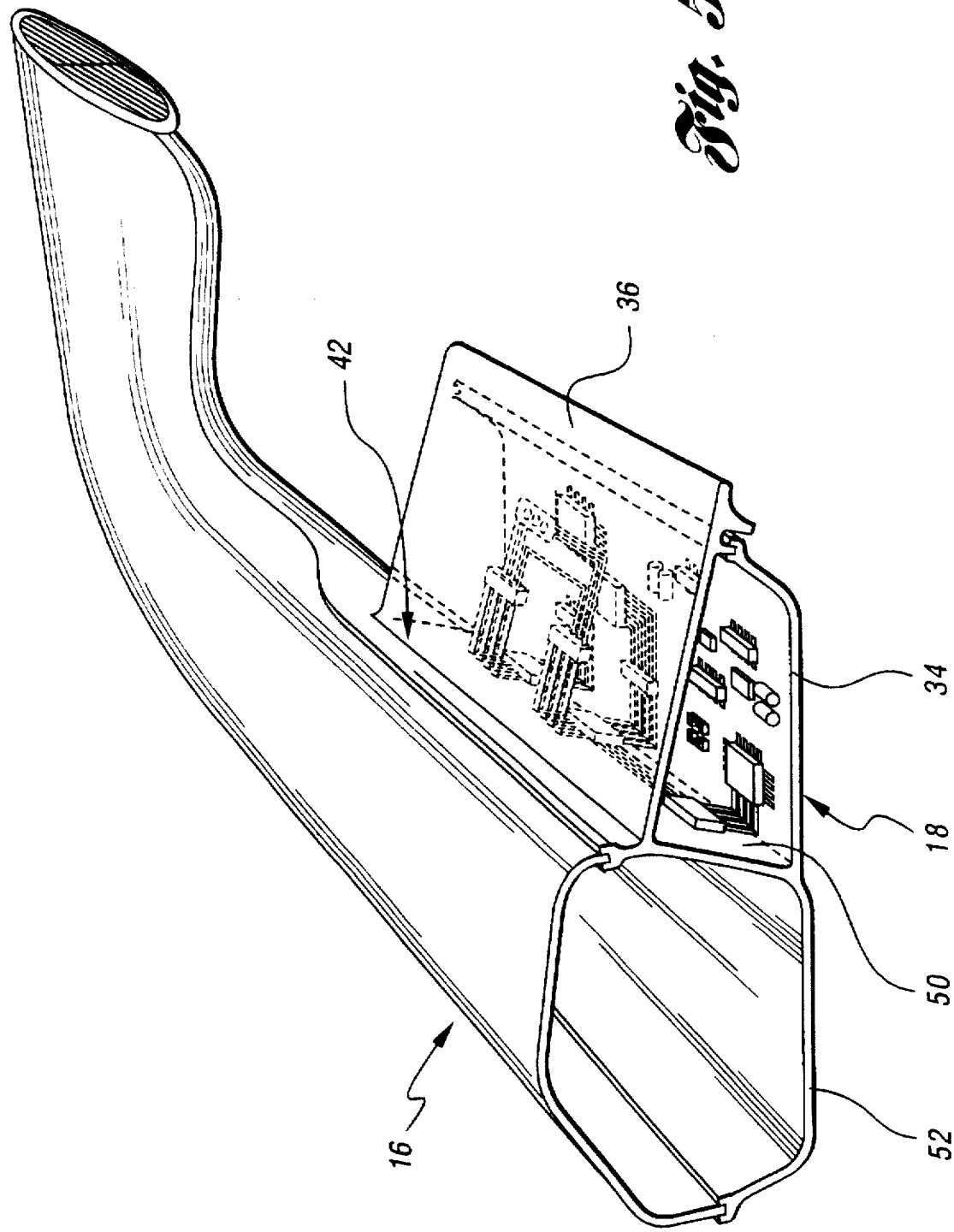
FIG. 5 shows a partially cutaway perspective view of an alternative embodiment of a ventilation duct and electronics housing in accordance with the present invention.

An alternative embodiment of the present invention is shown in FIG. 5. In this embodiment, both the support portion 34 and the cover 36 are integrally molded with the second shell portion 52. This design provides a housing which is designed so that electronic circuitry can be applied to form a continuous circuit on the support portion 34, inner wall 50, and cover 36, with circuit lines acting as a connection between the support portion 34 and cover 36. This circuit can have devices located about the entire interior of the housing 18.

The second shell portion 52 will be molded with the watershed cover 36 in an open position. The hinge line (or score line) 42 may be formed externally, and the interior should have a radius of 0.25 inches or larger. This design allows access for metallizing the interior surface of the enclosure housing and for populating it with electronic devices. Once populated, the lid can be closed by flexing at the hinge line, and with the metallization being copper and highly ductile, the metallization will bend accordingly along the radiused internal hinge surface without fracturing. This design will allow for repeated opening and closing of the lid.

The various electronic devices stored within the housing are electrically interfaced by a plurality of circuit traces which are laid against the housing interior surface. Several methods are known for the production of electronic circuitry on three dimensional parts. For example, a pattern plating process consists of electroless copper deposition followed by plating resist deposition, photo imaging the plating resist, solvent developing the plating resist, and electroplating copper; and a panel plating process consists of electroless copper deposition followed by electrolytic copper deposition over the entire part. In the panel plating process, the electrical circuit traces are formed by either laser ablation or selective etching using photo-imaged etch resist. Further examples include metal foil embossing where copper foil is stamped onto a three dimensional part using a complex, machined stamping dye; in-molding flexible film circuitry during the injection molding process; and embedded wire technology in which insulated electrical wiring is ultrasonically embedded into a plastic surface.

All of these processes rely on material characteristics of the substrate to which they are applied to meet various electrical/electronic requirements. For example, electronic grade substrate materials must be able to withstand severe manufacturing environments including harsh solvent exposures and high temperature soldering processes. Some polymeric substrate materials exist with adequate thermal, chemical, and physical properties to withstand such operations. Examples of such materials include polyetherimide (PEI), polyethersulfone (PES), and liquid crystal polymers (LCP). However, these materials are often prohibitively expensive, difficult to process, and have limited design potential.

Some common engineering plastics cannot withstand the processing or operational environments encountered in electrical/electronic applications. These materials, for example, cannot withstand exposure to typical circuit processing chemicals including etchants, solvents, and plating chemicals. These resin systems, however, offer superior mechanical and design properties at a fraction of the cost of typical electronic/electrical grade materials.

The present invention utilizes methods known in plastic processing to fabricate a multi-polymer structure having the desired mechanical and electronic grade properties. Electronic grade resin systems are those materials capable of meeting printed wiring board manufacturing process requirements. The areas of the multi-polymer structure containing electronic grade resin materials will be circuitized using known methods such as electroplating, or embossing, and are then populated with electronic components. These areas will be processed according to conventional circuit board assembly manufacturing processes. The structure created will further incorporate low cost engineering thermoplastic resins as the main structural component. Within the same structure, therefore, selective areas of electronic/electrical grade resin systems may be molded to impart the properties necessary for electronic/electrical manufacturing and assembly, while other areas may be molded from low cost engineering resins to impart mechanical and design properties at a low cost. Advanced plastics processing technologies such as co-injection molding and co-extrusion make these designs possible. The finished part will have mechanical and design properties of the low cost engineering resin with a capacity for integrated electronics in one low cost system. This integration of electronic circuitry into structural components reduces overall material costs from separate electronic/electrical and mechanical substrates, reduces overall material cost and weight, and reduces part count while increasing reliability.

The resin materials implemented in these structures must comply with two fundamental requirements. First, the materials must exhibit adequate physical, thermal, environmental, and electrical properties to meet the requirements of the intended application. Second, the materials chosen must be compatible with one another so that interfacial bonding may be maintained during processing and operation to avoid mechanical failure. Examples of resin systems that may potentially exhibit compatibility in these applications include: 1) ABS (structural) with PPO/PS (electrical); 2) polyethylene (structural) with reinforced polypropylene (electrical), etc.

Numerous geometric variations exist for this technology, including, for example: 1) the electronic grade resin materials may form only a surface coating of the finished part, the bulk being composed of low cost engineering thermoplastic resins; 2) the electronic grade resin materials may run on one or multiple sides of a three dimensional component to allow 3-D electrical current flow; 3) the electronic grade resin materials may run through the cross-section of a part to allow the incorporation of electrical through-hole technologies; and 4) the electronic grade materials should be used only in areas requiring electronics to minimize cost, however, electronic grade materials may be used outside the electronics region in order to gain other resin properties such as dimensional stability, modulus, etc.

Figure 6:
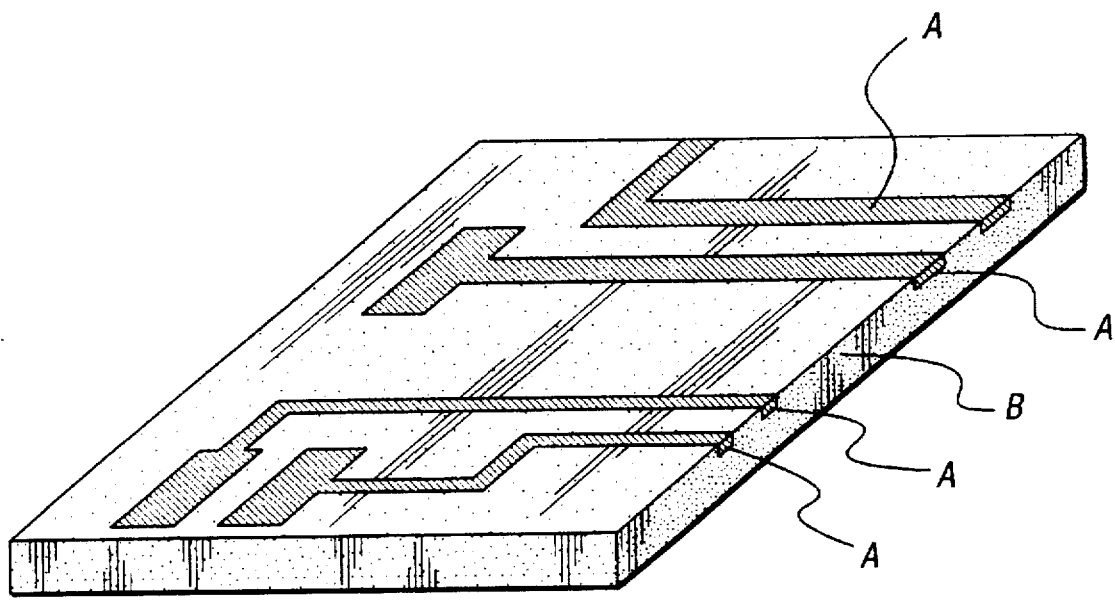
FIG. 6 shows a cut-away perspective view of an alternative molded housing component in accordance with the present invention.

An embodiment of such a co-injection molded housing component is shown in perspective view in FIG. 6. In this embodiment, material designated "A" comprises an electrical grade polymer, while material designated "B" comprises a non-electrical grade polymer, such that the "B" polymer may be a less expensive support material, while the "A" polymer is adapted for receiving circuit traces and electronic devices thereon.

While the best modes for carrying out the invention have been described in detail, those familiar with the art to which this invention relates will recognize various alternative designs and embodiments for practicing the invention within the scope of the appended claims.

What is claimed is:

1. An apparatus for conveying air and for housing active electronic devices in a vehicle, comprising:

a molded two-piece duct in a vehicle with means for conveying air in the vehicle; and a separable enclosed housing integrally molded with the duct mounting active electronic devices therein said housing not being in fluid communication with the duct.

2. The apparatus of claim 1, wherein said duct comprises first and second mating shell portions, and said housing comprises a support portion extending from said second shell portion and a cover extending from said first shell portion cooperating with said support portion and forming said housing for enclosing the electronic devices.

3. The apparatus of claim 2, wherein said cover overhangs said support portion to act as a watershed to prevent liquids from entering the housing and coming into contact with the stored electronic devices.

4. The apparatus of claim 3, wherein said cover and duct comprise a score line formed therebetween to facilitate bending of the cover with respect to the duct for access to the electronic devices.

5. The apparatus of claim 2, wherein said support portion and said cover each comprise an outboard edge, and one of said outboard edges comprises a slot formed therealong mating with the other of said outboard edges securing the edges together.

6. The apparatus of claim 2, wherein said cover is metallized.

7. The apparatus of claim 2, further comprising a blower positioned in fluid communication with said housing for blowing air through the housing for cooling the electronic devices.

8. The apparatus of claim 7, further comprising a tube in fluid communication with the housing for carrying the blown air away from the housing.

9. An apparatus for conveying air and for housing active electronic devices in a vehicle, comprising:

a molded duct for conveying air in the vehicle comprising first and second separate mating molded shell portions;

an enclosed housing molded integrally with said second shell portion and comprising a cover and a support portion extending from the second shell portion and cooperating to form said housing, said housing not being in fluid communication with said duct; and wherein said cover and said second shell portion comprise a score line formed therebetween to facilitate bending of the cover with respect to the duct for access to the electronic devices, and wherein the active electronic devices are mounted in the housing.

10. An apparatus for carrying air and for housing active electronic devices in a vehicle, comprising:

a molded duct for conveying air in the vehicle, said duct comprising first and second separable mating molded shell portions;

an enclosed housing secured to the duct mounting said active electronic devices therein said housing not being in fluid communication with the duct, and said housing further comprising a cover and a support portion extending from the first and second mating shell portions, respectively, for forming said housing, said cover and support portion being integrally molded with said first and second shell portions, respectively;

wherein said cover overhangs said support portion to act as a watershed to prevent liquids from entering the housing and coming into contact with the stored electronic devices, and wherein said cover and duct comprise a score line formed therebetween to facilitate bending of the cover with respect to the duct for electronics access; and said apparatus further comprising a blower positioned in fluid communication with said housing for blowing air through the housing for cooling the electronic devices.

* * * * *